(12) United States Patent
Lee

(10) Patent No.: US 6,172,423 B1
(45) Date of Patent: Jan. 9, 2001

(54) LAYER-TYPE BALL GRID ARRAY SEMICONDUCTOR PACKAGE AND FABRICATION METHOD THEREOF

(75) Inventor: Jong Hyun Lee, Choongcheongbuk-Do (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/182,195

(22) Filed: Oct. 30, 1998

(30) Foreign Application Priority Data

Nov. 15, 1997 (KR) .................................. 97-60262

(51) Int. Cl.[7] .......................... H01L 23/48; H01L 23/52; H01L 29/40
(52) U.S. Cl. .......................... 257/780; 257/686; 257/685; 257/784; 257/779; 257/711; 257/723; 257/737; 257/692; 438/109; 438/108; 438/106
(58) Field of Search .................................. 257/686, 685, 257/690, 678, 738, 777, 780, 784, 787, 711, 778, 723, 737, 699, 696, 779, 692; 438/109, 108, 106

(56) References Cited

U.S. PATENT DOCUMENTS

| | | | |
|---|---|---|---|
| 5,043,794 | * 8/1991 | Tai et al. | 357/74 |
| 5,172,303 | * 12/1992 | Bernardoni et al. | 361/396 |
| 5,214,308 | * 5/1993 | Nishiguchi et al. | 257/692 |
| 5,241,133 | 8/1993 | Mullen, III et al. | 174/52.4 |
| 5,247,423 | * 9/1993 | Lin et al. | 361/719 |
| 5,375,041 | * 12/1994 | McMahon | 361/749 |
| 5,640,048 | 6/1997 | Selna | 257/738 |
| 5,747,874 | * 5/1998 | Seki et al. | 257/686 |
| 5,767,528 | * 6/1998 | Sumi et al. | 257/48 |
| 5,838,060 | * 11/1998 | Comer | 257/685 |

* cited by examiner

Primary Examiner—Steven H. Loke
Assistant Examiner—Luan Thai
(74) Attorney, Agent, or Firm—Fleshner & Kim, LLP

(57) ABSTRACT

A layer-type ball grid array (BGA) semiconductor package, module and methods of manufacturing same is provided that expands the capability of the package in a limited area. The BGA semiconductor package and method of manufacturing same includes a substrate having a cavity formed therein and an interconnection pattern layer that has a plurality of conductive interconnections forming electric channels between or electrically coupling upper and lower surfaces of the substrate is attached to an external surface of the substrate. The interconnection pattern layer extends from the upper surface to the lower surface of the substrate. A semiconductor chip is provided in bottom of the cavity and a plurality of conductive wires electrically couple the semiconductor chip to one of the conductive interconnections. A molding part fills in the cavity for sealing the semiconductor chip and wires. A plurality of solder balls are correspondingly attached to the conductive interconnections of the interconnection pattern layer formed on the lower surface of the substrate.

20 Claims, 3 Drawing Sheets

LAYER-TYPE BALL GRID ARRAY SEMICONDUCTOR PACKAGE AND FABRICATION METHOD THEREOF

BACKGROUND OF THE INVENTION

1. Field of the Invention

The present invention relates to a semiconductor package, and in particular to a ball grid array semiconductor package and a fabrication method thereof.

2. Background of the Related Art

A quad flat package (QFP) is a widely used multipin semiconductor package. However, as a semiconductor package is required to have more pins, a QFP has problems because a lead is easily bent when a width of an outlead becomes narrower and a pitch between leads becomes finer. Further, it is difficult to array a printed circuit board (PCB) and the QFP package while controlling quantity of solder when mounting the package on the PCB. Accordingly, ball grid array (BGA) semiconductor packages, which contain multiple pins and solve the above problems, are being used. The BGA semiconductor package has no outlead because solder balls serve as the outlead, which solves the defects of the QFP.

FIG. 1 is a diagram showing a vertical cross-section of a related art BGA semiconductor package. As shown therein, the related art BGA semiconductor package includes a substrate 1 in which a plurality of patterned conductive lines (not shown) are installed, a semiconductor chip 2 attached on an upper surface of the substrate 1 by an adhesive 3, a plurality of conductive wires 4 electrically connecting the semiconductor chip 2 and one end of each of the patterned conductive lines installed in the substrate 1, a molding part 5 and a plurality of solder balls 6. The molding part 5 formed on the upper surface of the substrate 1 seals the semiconductor chip 2 and the conductive wires 4. The plurality of solder balls 6 are fixed to a lower surface of the substrate 1 in order to be connected with the other ends of the patterned conductive lines installed in the substrate 1. Each of the patterned conductive lines becomes an electric channel for connecting the upper and lower parts of the substrate.

However, since the related BGA semiconductor package shown in FIG. 1 has the solder balls, which become input and output terminals of an electric signal, only on the lower surface thereof, it is difficult or impossible to manufacture a package module with multiple layers of semiconductor packages. Accordingly, it is difficult to expand functional capacities and capabilities in a limited area by layering plural semiconductor packages.

SUMMARY OF THE INVENTION

An object of the present invention to provide a layer-type ball grid array (BGA) semiconductor package and a fabrication method thereof that substantially obviates at least one of the above-described problems of the related art.

Another object of the present invention to provide a layer-type ball grid array (BGA) semiconductor package and a fabrication method thereof that permits layering multiple semiconductor packages.

Another object of the present invention to provide a layer-type ball grid array (BGA) semiconductor package and a fabrication method thereof that expands BGA semiconductor capacity and capability in a limited area.

Another object of the present invention to provide a layer-type ball grid array (BGA) semiconductor package and a fabrication method thereof that electrically couples opposing surfaces of a substrate via an external surface of the substrate.

Another object of the present invention to provide a multiple-layer ball grid array (BGA) semiconductor package and a fabrication method thereof that permits layering semiconductor packages using only a reflow soldering process.

To achieve at least the above objects in a whole or in parts, there is provided a BGA semiconductor package according to the present invention that includes a substrate having a cavity in an upper surface; an interconnection layer having a plurality of conductive interconnections forming electric channels between the upper surface and a lower surface of the substrate wherein the interconnection layer is attached to an external surface of the substrate and extends from the upper surface to the lower surface; a semiconductor chip placed on a bottom of the cavity; a plurality of conductive wires electrically coupling the semiconductor chip to each conductive interconnection; a molding part in the cavity to seal the semiconductor chip and the wires, and a plurality of solder balls correspondingly attached to the conductive interconnections of the interconnection layer on the lower surface of the substrate.

To further achieve the above objects in a whole or in parts, there is provided a BGA semiconductor package fabrication method according to the present invention that includes providing a substrate having upper and lower surfaces; forming a cavity in a part of the upper surface of the substrate; attaching an interconnection pattern layer having a plurality of patterned conductive interconnections that extends from the upper surface to the lower surface of the substrate except in the cavity; attaching a semiconductor chip to a bottom of the cavity; electrically coupling the semiconductor chip to first ends of the corresponding conductive interconnections by a plurality of conductive media; forming a molding part that packages the semiconductor chip and the wires; and attaching a plurality of solder balls to second ends of the conductive interconnections on the lower surface of the substrate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
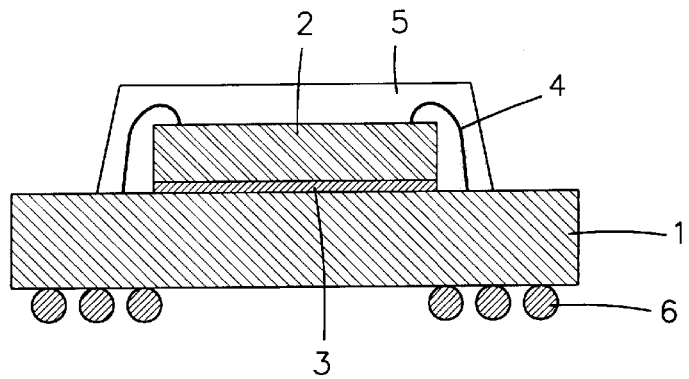
FIG. 1 is a diagram showing a cross-section of a related art ball grid array (BGA) semiconductor package.
Figure 2:
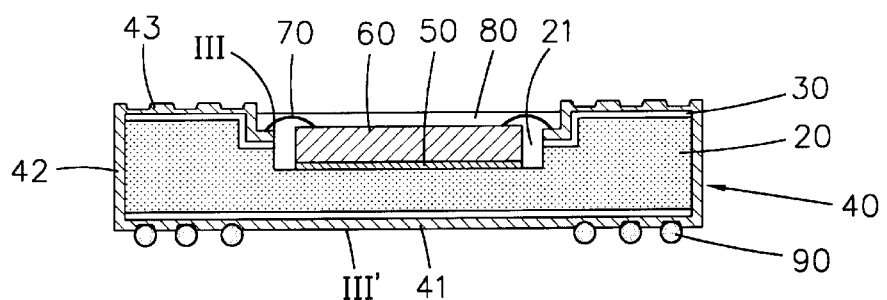
FIG. 2 is a diagram showing a cross-section of a preferred embodiment of a BGA semiconductor package according to the present invention.

FIG. 2 is a diagram showing vertical cross-sectional view of a first preferred embodiment of a BGA semiconductor package according to the present invention. As shown therein, the first preferred embodiment of the BGA semiconductor package includes a preferably rectangular substrate 20 of insulating substance, an interconnection pattern layer 40 and a cavity 21 preferably formed in a center part of an upper surface of the substrate 20. However, the present invention is not intended to be so limited. For example, the cavity 21 can be offset to one side of the upper surface of the substrate 20. The interconnection pattern layer 40 is preferably attached to an external surface of the substrate 20 and extends from the upper surface to the lower surface of the substrate 20 except where the cavity 21 is formed. The interconnection pattern layer 40 is preferably attached by a first adhesive 30 such as glue or the like.

Figure 3:
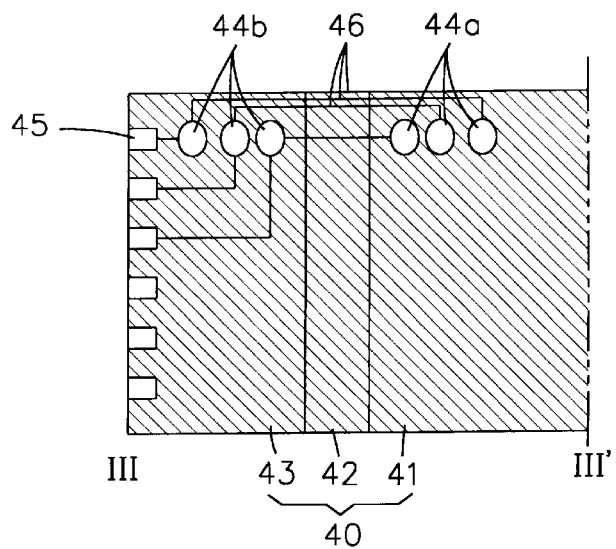
FIG. 3 is a diagram showing an interconnection pattern layer in FIG. 2.

The interconnection pattern layer 40 will now be described in detail with reference to FIG. 3. FIG. 3 is a diagram showing a plan view from III—III of the interconnection pattern layer 40 of FIG. 2 separated from the substrate 20. The interconnection pattern layer 40 includes first 41, second 42, and third 43 parts that are preferably sequentially attached to the lower surface, side surfaces, and the upper surface, respectively, of the substrate 20. A plurality of first external terminal pads 44a are formed on the first part 41 of the interconnection pattern layer 40 and a plurality of second external terminal pads 44b, which respectively correspond to the first external terminal pads 44a, are formed on the third part 43. That is, each of the first external terminal pads 44a attached to the lower surface of the substrate 20 preferably symmetrically corresponds to one of the second external terminal pads 44b attached to the upper surface of the substrate 20. A plurality of internal terminal pads 45, respectively corresponding to the first external terminal pads 44a (or the second external terminal pads 44b), are preferably provided on a side end portion of the third part 43 of the interconnection pattern layer 40. A plurality of patterned conductive interconnections 46 electrically couple the internal terminal pads 45, and the first and second external terminal pads 44a, 44b. In addition, each of the first and second external terminal pads 44a, 44b is preferably a hemispheric recess type.

As shown in FIG. 2, a semiconductor chip 60 is attached to a bottom of the cavity 21 by a second adhesive 50 such as an epoxy or the like, and the semiconductor chip 60 and the internal terminal pads 45 formed on the interconnection pattern layer 40 are electrically coupled to each other by conductive media such as a plurality of conductive wires 70. A molding part 80, which is an epoxy molding compound or the like, packages the semiconductor chip 60 and the wires 70. The molding part 80 preferably fills the cavity 21 to seal the semiconductor chip 60 and the wires 70. A plurality of solder balls 90 are respectively attached on the first external terminal pads 44a provided in the first part 41 of the interconnection pattern layer 40.

Figure 4A:
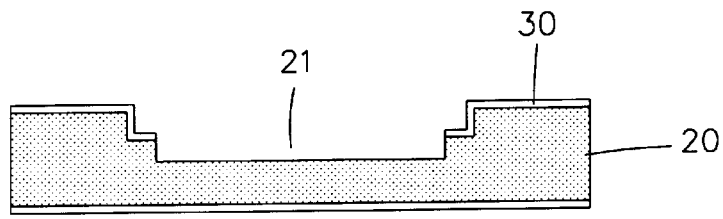
FIGS. 4A to 4D are diagrams showing cross-sections that sequentially illustrate a preferred embodiment of a BGA semiconductor package fabrication method according to the present invention.

With reference to FIGS. 4A to 4D, a second preferred embodiment according to the present invention of a fabrication method of the BGA semiconductor package will now be described. As shown in FIG. 4A, the substrate 20 having opposing surfaces such as the upper and lower surfaces is provided, and the cavity 21 is preferably formed in the center part, for example, of the upper surface of the substrate 20. The cavity 21 preferably has steps at each end that are shallower than a bottom surface. The first adhesive 30 is applied on the lower and upper surfaces of the substrate 20. Glue is preferably used as the first adhesive 30.

Figure 4B:
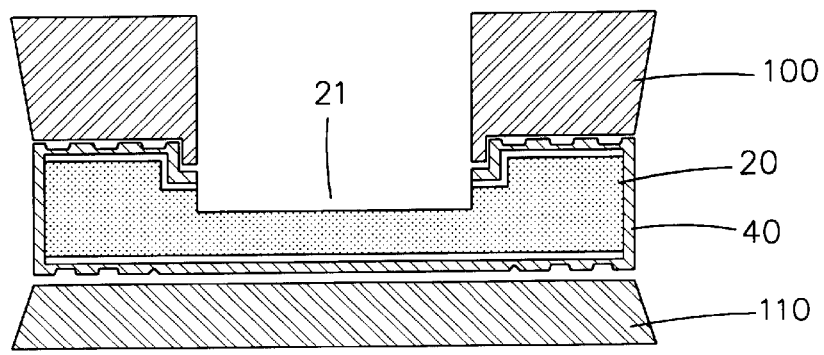

As shown in FIG. 4B, the interconnection pattern layer 40 adhesively covers the upper, lower, and side surfaces of the substrate 20. The interconnection pattern layer 40 and the substrate 20 are heat-treated and pressed by an upper mold 100 and a lower mold 110 to be tightly attached to each other. The bottom part of the cavity 21 is externally exposed, so that at least the bottom thereof is not covered with the interconnection pattern layer 40.

Figure 4C:
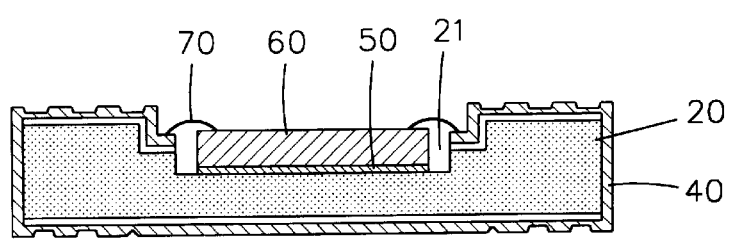

As shown in FIG. 4C, the semiconductor chip 60 is attached to the bottom surface of the cavity 21 by the second adhesive 50. The semiconductor chip 60 and the internal terminal pads 45 of the interconnection pattern layer 40 are electrically coupled to each other by the conductive wires 70.

Figure 4D:
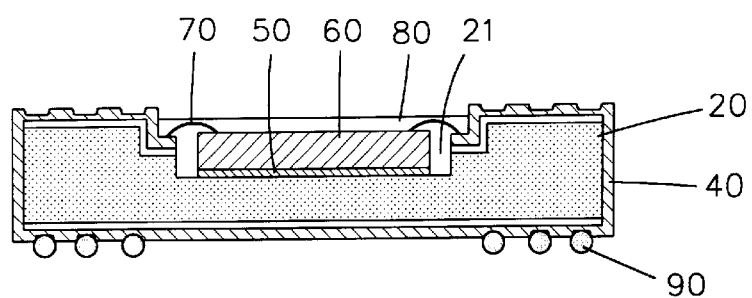

As shown in FIG. 4D, the epoxy molding compound substantially fills in the cavity 21 to form the molding part 80 for packaging or sealing the semiconductor chip 60 and the wires 70. The solder balls 90 are respectively attached to the corresponding first external terminal pads 44a formed on the first part 41 of the interconnection pattern layer 40. Then, the second preferred embodiment of the fabrication method of the BGA semiconductor package according to the present invention is complete. The package shown in FIG. 4D is substantially identical to the package shown in FIG. 2.

Figure 5:
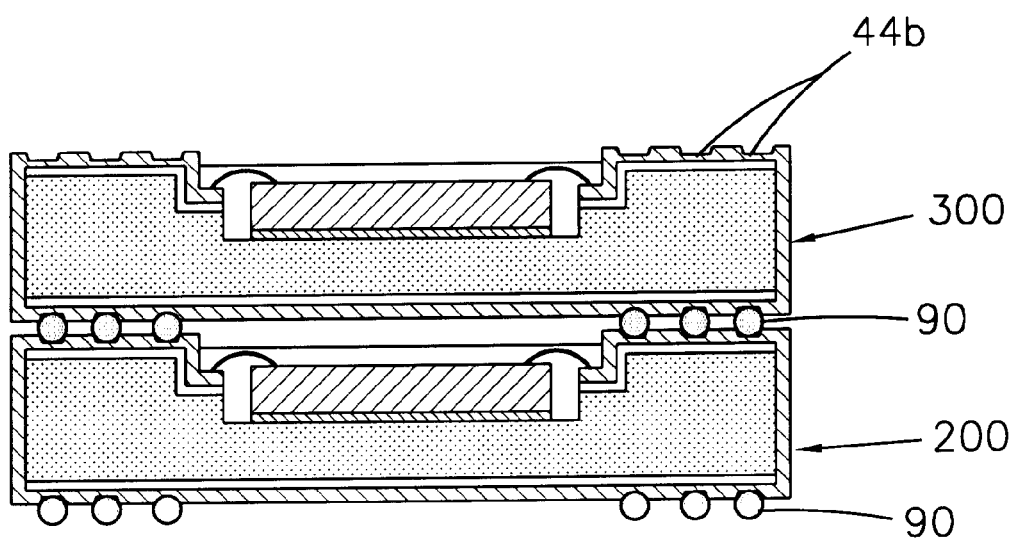
FIG. 5 is a diagram showing a cross-section of a preferred embodiment of a BGA semiconductor package module according to the present invention.

FIG. 5 illustrates a third preferred embodiment according to the present invention of a BGA semiconductor package module manufactured by layering multiple BGA semiconductor packages. Exemplary examples of the semiconductor packages of the third preferred embodiment of a module are shown in FIG. 4D. As shown in FIG. 5, a plurality of solder balls 90 of an upper BGA semiconductor package 300 are correspondingly placed on a plurality of second external terminal pads 44b of a lower BGA semiconductor package 200 to layer the two BGA semiconductor packages 200, 300. The BGA semiconductor package module is preferably completed by a reflow soldering process. The solder balls 90 are preferably fused and hardened by the reflow soldering process to solidly attach the two upper and lower BGA semiconductor packages 200, 300 together and the solder balls 90 to the two BGA semiconductor packages 200, 300.

According to the preferred embodiments of the present invention, common terminals are preferably formed on the upper and lower surfaces of the substrate and are electrically coupled to each other using the interconnection pattern layer. Thus, BGA semiconductor package modules with multiple-layers of BGA semiconductor packages can be produced.

The interconnection pattern layer according to the preferred embodiments is provided with first, second, and third parts that are sequentially attached to lower, side, and upper surfaces, respectively, of the substrate. A plurality of first external terminal pads are formed on the first part to which the solder balls are correspondingly attached and a plurality of second external terminal pads are formed on the third part that preferably symmetrically correspond to the first external terminal pads. A plurality of internal terminal pads are formed on a portion of the third part where the wires are bonded. In addition, the above first and second external terminal pads, and internal terminal pads are electrically coupled to each other by the conductive interconnections. Preferably, each of the first and second external terminal pads, and internal terminal pads are formed in a hemispheric recess type.

Since the first and second external terminal pads, which are respectively provided on the lower and upper surfaces, of the substrate correspond to each other, are electrically coupled and have common terminals, electric channels are formed that electrically couple the upper surface with the lower surface of the substrate. Additionally, since the solder balls are correspondingly attached to the hemispheric first external terminal pads, the solder balls can be easily adhered thereto when fabricating the BGA semiconductor package. Further, the solder balls can be attached to the second external terminal pads of adjacent BGA semiconductor packages when forming a BGA semiconductor module. Thus, multiple BGA semiconductor packages can be layered. Further, the BGA module can be easily layered using a reflow soldering process.

As described above, the preferred embodiments of a layer-type BGA semiconductor package, a BGA semiconductor module and the fabrication methods thereof according to the present invention have various advantages. The preferred embodiments can manufacture a BGA semiconductor package module, in which a plurality of BGA semiconductor packages are layered, by only providing the reflow soldering without any additional process. The BGA semiconductor package module also expands a functional capacity of the semiconductor package in a limited area.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A semiconductor package, comprising:
a substrate having a cavity in an upper surface;
a first layer extending from the upper surface to a lower surface of the substrate, the first layer including a plurality of conductive interconnections forming electric channels between the upper and lower surfaces of the substrate and being attached to an external surface of the substrate, at least one of the conductive interconnections having a first indentation on the upper surface of the substrate and a second indentation on the lower surface of the substrate;
a semiconductor chip provided in the cavity; and
a plurality of conductive media that electrically couple the semiconductor chip to a first end of each of the conductive interconnections,
wherein the first and second indentations of the at least one conductive interconnection are configured to be attached to solder balls.

2. The package of claim 1, wherein the first layer comprises a first part, a second part, and a third part, which are attached to the lower surface, at least one side surface, and the upper surface, respectively, of the substrate.

3. The package of claim 2, wherein a plurality of first external terminal pads are formed on the first part, and a plurality of second external terminal pads that correspond to the first external terminal pads are formed on the third part, and a plurality of internal terminal pads are formed on a side end part of the third part.

4. The package of claim 3, wherein the first external terminal pads on the lower surface of the substrate are configured to be attached to solder balls.

5. The package of claim 4, wherein the semiconductor package is a first ball grid array (BGA) semiconductor package, further comprising a second BGA semiconductor package, and wherein a plurality of solder balls couple the first external terminal pads of the second BGA semiconductor package to the second external terminal pads of the first BGA semiconductor package.

6. The package of claim 3, wherein the first and second terminal pads are symmetrically located on the upper and lower surfaces.

7. The package of claim 3, wherein the first and second external terminal pads, and the internal terminal pads are electrically coupled to each other, and wherein the internal terminal pads and the semiconductor chip are coupled by the conductive media.

8. The package of claim 1, further comprising a molding part that packages the semiconductor chip and the plurality of conductive media.

9. The package of claim 1, wherein the first layer is an interconnection pattern layer attached to the surface of the substrate by a first adhesive member, and wherein the first adhesive member is glue.

10. The package of claim 1, wherein the cavity is formed in a center portion of the upper surface.

11. The package of claim 1, wherein the semiconductor chip is attached to a bottom of the cavity by a second adhesive member, and wherein the second adhesive member is an epoxy.

12. The package of claim 8, wherein the plurality of the conductive media are wires, and wherein the molding part substantially fills the cavity to seal the semiconductor chip and the wires.

13. A BGA semiconductor module, comprising:
a first BGA semiconductor package; and
a second BGA semiconductor package, wherein each of the packages comprises,
a substrate having a cavity in an upper surface,
a pattern layer extending from the upper surface to a lower surface of the substrate, the pattern layer including a plurality of conductive interconnections electrically coupling the upper and the lower surfaces of the substrate and being attached to an external surface of the substrate, at least one of the conductive interconnections having a first indentation on the upper surface of the substrate and a second indentation on the lower surface of the substrate,
a semiconductor chip provided in the cavity,
a plurality of conductive media that electrically couple the semiconductor chip to the conductive interconnections, and
a plurality of solder balls attached to the second indentations of the conductive interconnections of the pattern layer on the lower surface of the substrate,
wherein the solder balls of the second BGA semiconductor package are also coupled to the first indentations of the conductive interconnections of the first BGA semiconductor package on the upper surface of the first BGA semiconductor package.

14. The module of claim 13, wherein the pattern layer comprises a first part, a second part, and a third part, which are attached to the lower surface, at least one side surface, and the upper surface, respectively, of the substrate.

15. The module of claim 14, wherein a plurality of first external terminal pads are formed on the first part, and a plurality of second external terminal pads that correspond to the first external terminal pads are formed on the third part, and a plurality of internal terminal pads are formed on a side end part of the third part.

16. The module of claim 15, wherein the first and second terminal pads are symmetrically located on the upper and lower surfaces.

17. The module of claim 15, wherein the first and second external terminal pads, and the internal terminal pads are electrically coupled to each other, and wherein the internal terminal pads and the semiconductor chip are coupled by the conductive media.

18. The module of claim 13, further comprising a molding part that packages the semiconductor chip and the plurality of conductive media.

19. The module of claim 18, wherein the plurality of the conductive media are wires, and wherein the molding part substantially fills the cavity to seal the semiconductor chip and the wires.

20. The module of claim 13, wherein the cavity is formed in a center portion of the upper surface.

* * * * *